(12) United States Patent
Martens

(10) Patent No.: US 9,606,212 B1
(45) Date of Patent: Mar. 28, 2017

(54) SYSTEMS AND METHODS FOR TIME/FREQUENCY INDEXED PULSE CALIBRATIONS FOR VECTOR NETWORK ANALYZERS

(71) Applicant: ANRITSU COMPANY, Morgan Hill, CA (US)

(72) Inventor: Jon S. Martens, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 168 days.

(21) Appl. No.: 14/213,134

(22) Filed: Mar. 14, 2014

Related U.S. Application Data

(60) Provisional application No. 61/793,702, filed on Mar. 15, 2013.

(51) Int. Cl.
*G01R 35/00* (2006.01)
*G01R 31/00* (2006.01)

(52) U.S. Cl.
CPC .................. *G01R 35/005* (2013.01)

(58) Field of Classification Search
CPC ...................................................... G01R 35/005
USPC .................................................. 324/601, 638
See application file for complete search history.

(56) References Cited

U.S. PATENT DOCUMENTS

| | | | |
|---|---|---|---|
| 6,396,285 B1* | 5/2002 | Blackham | G01R 27/32 324/601 |
| 2006/0003723 A1* | 1/2006 | Shoulders | G01R 27/32 455/286 |

* cited by examiner

*Primary Examiner* — Farhana Hoque
(74) *Attorney, Agent, or Firm* — Tucker Ellis LLP

(57) ABSTRACT

A method for measuring scattering parameters in a device under test (DUT) using a vector network analyzer (VNA), includes calibrating the VNA to generate corrections for deterministic setup defects and mapping a plurality of error terms based on a plurality of time indices, wherein each time indicia is associated with an error term. A test signal is transmitted to the DUT to obtain a measurement signal from the DUT in response to the test signal. The generated corrections to obtained measurements are time aligned based on the mapped error terms.

17 Claims, 4 Drawing Sheets

SYSTEMS AND METHODS FOR TIME/FREQUENCY INDEXED PULSE CALIBRATIONS FOR VECTOR NETWORK ANALYZERS

CLAIM OF PRIORITY

This application claims the benefit of priority to U.S. Provisional Application titled "SYSTEMS AND METHODS FOR TIME/FREQUENCY INDEXED PULSE CALIBRATIONS FOR VECTOR NETWORK ANALYZERS", Application No. 61/793,702, filed Mar. 15, 2013, which application is herein incorporated by reference

TECHNICAL BACKGROUND

The present invention relates to vector network analyzers and pulse profiling measurements using vector network analyzers.

BACKGROUND

Radio frequency (RF) pulse profiling vector network analyzer (VNA) measurements are commonly used to evaluate a response of a device under test (DUT) to a pulse stimulus. FIG. 1 illustrates an exemplary set-up for measuring a two-port DUT, with a pulse modulator arranged between a VNA 100 and the DUT. DUT response details often evaluated in magnitude and phase include overshoot, droop, ringing, etc. FIG. 2 illustrates an example of a linear response of a base modulator. The measurement window includes a leading edge of a pulse. In a pulsed measurements system, when a stimulus is pulsed there are defects in the stimulus modulation that may be undesirably introduced by the pulse modulator (e.g., overshoot). These defects are in addition to defects attributable to the DUT.

Calibration of a VNA is performed prior to or during measurement to correct for deterministic setup defects such as mismatch, frequency-dependent loss, and finite directivity. Generally, it is assumed that any instrument-related stimulus pulsing effects have settled out prior to measurements being made either because it is difficult or there is not enough measurement time resolution to allow those effects to be noticed. Therefore, instrument-related stimulus pulsing effects are not commonly accounted for during calibration.

SUMMARY

In an embodiment, a method for measuring scattering parameters in a device under test (DUT) using a vector network analyzer (VNA), includes calibrating the VNA to generate corrections for deterministic setup defects and mapping a plurality of error terms based on a plurality of time indices, wherein each time indicia is associated with an error term. A test signal is transmitted to the DUT to obtain a measurement signal from the DUT in response to the test signal. The generated corrections to obtained measurements are time aligned based on the mapped error terms.

In an embodiment, a method further includes assembling a setup by connecting the VNA and a pulse modulator with the DUT, transmitting a radio frequency (RF) pulse profile test signal to the DUT, obtaining measurements of electrical performance of the DUT in response to the RF pulse profile test signal, and time aligning generated corrections to pulses in the obtained measurements based on the mapped error terms.

In an embodiment, a system for measuring scattering parameters in a DUT includes a VNA having a processor and a non-transitory computer readable storage medium. The storage medium has instructions thereon that when executed by the processor cause the system to calibrate the VNA to generate corrections for deterministic setup defects, map a plurality of error terms based on a plurality of time indices, wherein each time indicia is associated with an error term, transmit a test signal to the DUT, obtain measurements of electrical performance of the DUT in response to the test signal, and time align generated corrections to the obtained measurements based on the mapped error terms.

In an embodiment, the system includes a pulse modulator and the non-transitory computer readable medium further has instructions thereon that when executed by the processor cause the system transmit a RF pulse profile test signal to the DUT, obtain measurements of electrical performance of the DUT in response to the RF pulse profile test signal, and time align generated corrections to pulses in the obtained measurements based on the mapped error terms.

In an embodiment, non-transitory computer readable storage medium includes instructions stored thereon which when read and executed by one or more computers cause the one or more computers to perform steps comprising using a setup including a VNA connected with a DUT, calibrating the VNA to generate corrections for deterministic setup defects, mapping error terms based on a plurality of time indices, wherein each time indicia is associated with an error term, transmitting a test signal to the DUT, obtaining measurements of electrical performance of the DUT, and time aligning generated corrections to the obtained measurements based on the mapped error terms.

In an embodiment, the non-transitory computer readable storage medium includes instructions stored thereon which when read and executed by one or more computers cause the one or more computers to perform further steps comprising using a setup including a pulse modulator connected with the VNA and the DUT, transmitting a RF pulse profile test signal to the DUT, obtaining measurements of electrical performance of the DUT in response to the RF pulse profile test signal, and time aligning generated corrections to pulses in the obtained measurements based on the mapped error terms

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

As measurement resolution improves technologically, ignoring instrument-related stimulus pulsing effects is no longer practical and waiting for settling does not allow one to observe potentially interesting pulse-edge-related effects from a device-under-test (DUT) itself. As used herein, a DUT collectively and broadly refers to a device, system, network, or other component or components of an electrical system. The complications are that certain error coefficients will show modulation signatures at different times than others and the raw scattering (S-) parameter data may be affected at different times, so a brute-force calibration (using frequency-indexed values only) will produce inaccurate results.

By time-indexing as well as frequency-indexing the error coefficients and the raw input S-parameter data, the inventor has observed that it is possible, in certain circumstances, to properly remove the effects of the stimulus modulation defects from the data, allowing the inventor to observe the DUT parameters of interest alone.

Systems and methods in accordance with embodiments can be applied to pulsed parameter VNA measurements, in particular pulsed profile measurements of high resolution where it is desired to view DUT response patterns independent of stimulus modulation patterns.

Systems and methods in accordance with embodiments comprise an improved S-parameter calibration approach for pulsed measurements with stimulus modulation. In high resolution cases, the time transient effects of the stimulus can occlude accurate interpretation of DUT responses and conventional calibration approaches can worsen this data distortion. By time-indexing as well as frequency-indexing error coefficients and raw data, the stimulus distortion effects can be better removed in some cases and allow more accurate DUT response measurements. As a result it is possible to generate pulse profile S-parameters with high resolution and stimulus modulation and improve edge effect accuracy by removing stimulus effects.

Figure 1:
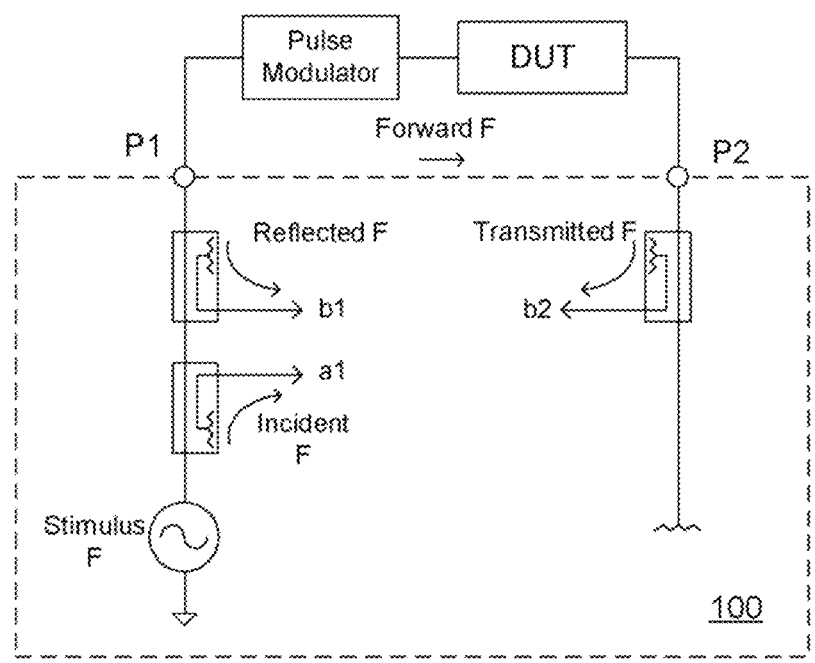
FIG. 1 is an exemplary system for use in performing pulse profile measurements of a DUT.
Figure 2:
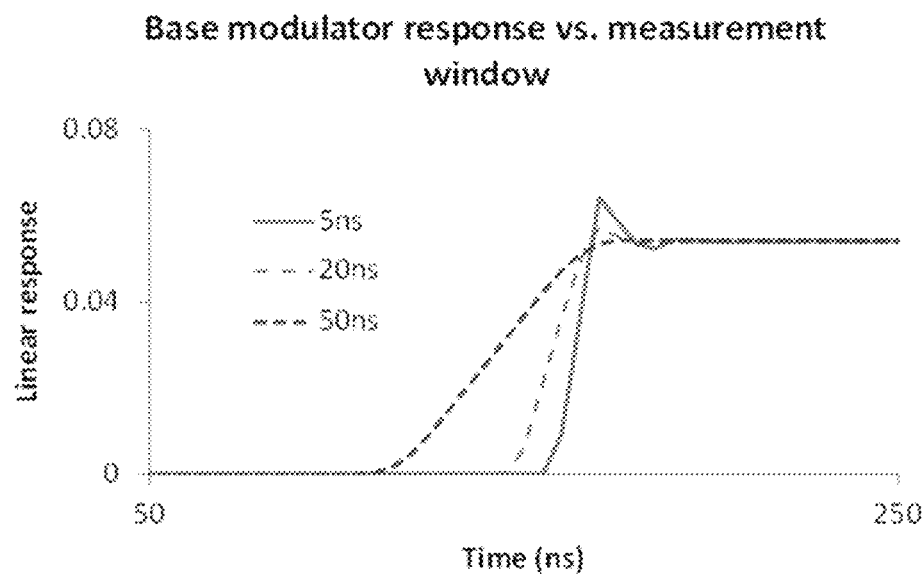
FIG. 2 is a graph illustrating base modulator response versus a measurement window of a VNA.
Figure 3:
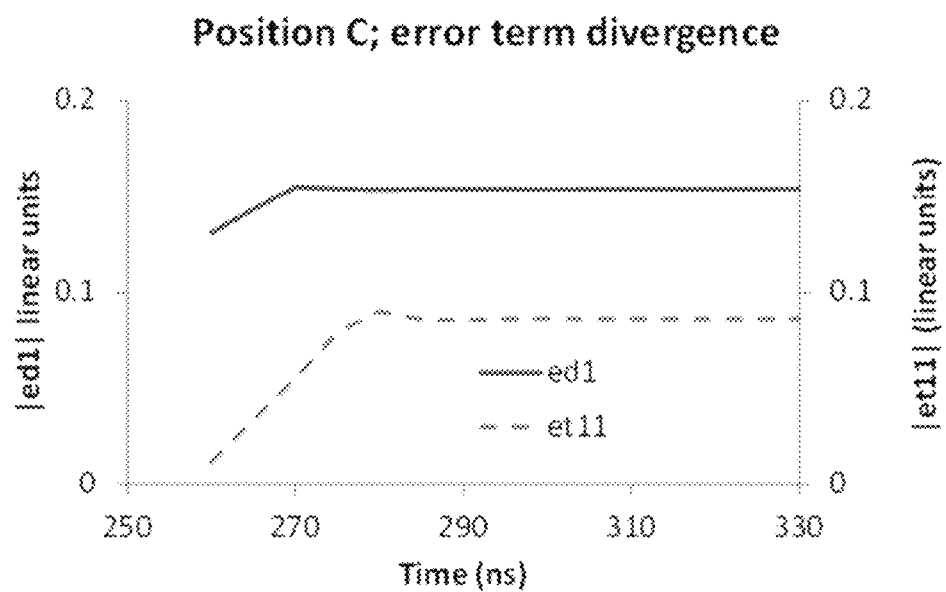
FIG. 3 is a graph illustrating error term divergence.

In a traditional VNA error model, there are terms of tracking, source match and directivity associated with each port (P1, P2 in FIG. 1). As a pulse with some overshoot (or other defect) propagates, the time location of that overshoot may vary. For example, as shown in FIG. 3, if the reference plane is well past the directional coupler, the directivity term (|ed1|) will be time advanced relative to the tracking term (|et11|), as can be seen. The error coefficients should reflect this.

Systems and methods in accordance with embodiments can maps error terms to time align corrections to a pulse. Error terms such as ed1(f,t), ep1S(f,t), et11(f,t) (these terms being directivity, source match, and reflection tracking, respectively) and so on, can be mapped so that the correction can be time aligned to a pulse and incoming pulse distortions are ameliorated. Further, raw (pre-correction) S-parameters of the DUT can be time misaligned for similar reasons (i.e., very different planes of reflection vs. transmission) and a similar time-realignment can similarly improve results.

Figure 4:
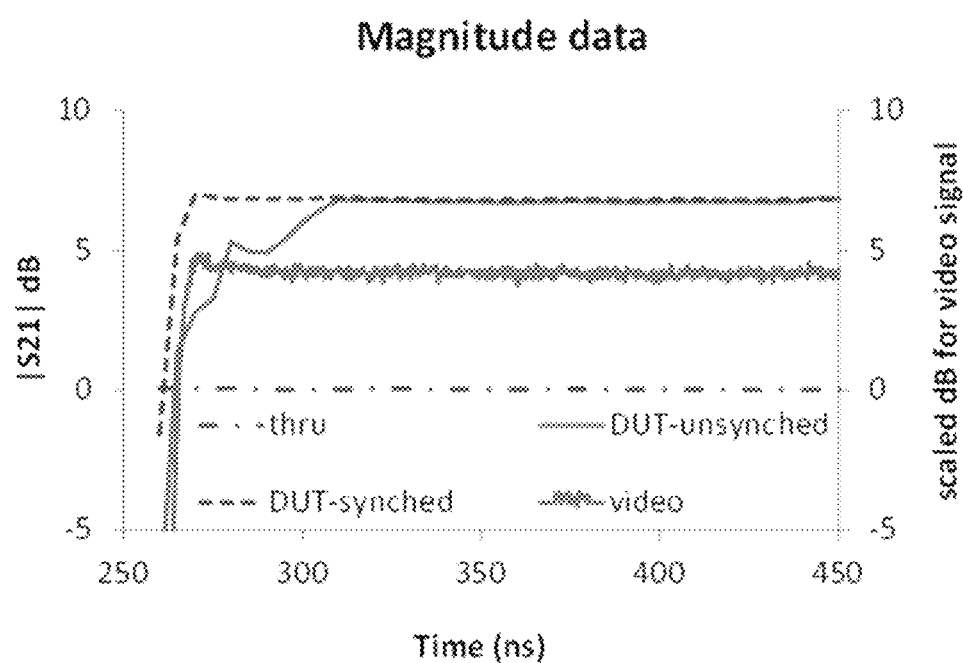
FIG. 4 is a graph illustrating signal response before and after mapping error terms with system and methods in accordance with the present invention.

Referring to FIG. 4, a DUT-unsynched curve represents magnitude data for forward transmission gain (|S21|) in decibels (dB) where no re-alignment has occurred and a DUT-synched curve represents magnitude data for the forward transmission gain that includes both error term and raw S-parameter re-alignment. As can be seen in the chart, mapping error terms to time align corrections can significantly improve response.

Figure 5:
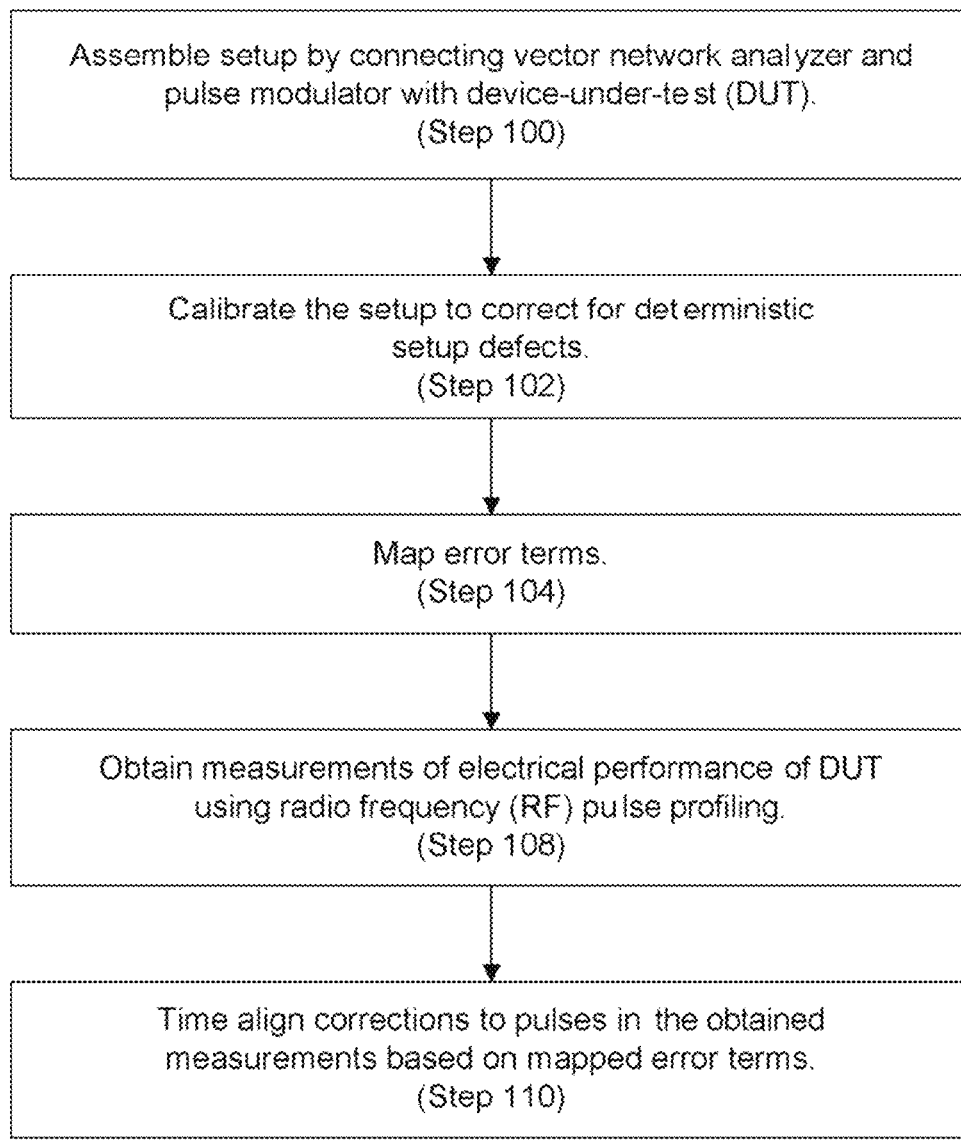
FIG. 5 is a flowchart of a method for time aligning corrections to pulses in obtained measurements.

FIG. 5 is a flowchart illustrated a method in accordance with an embodiment. A VNA is connected with a pulse modulator and a DUT is connected with the pulse modulator and the VNA (Step 100). The setup is calibrated to correct for deterministic setup defects (Step 102). The error terms can be mapped by time advancing certain error terms relative to other error terms (Step 104). A radio frequency (RF) pulse profile test signal can be transmitted to the DUT (Step 106). Measurements of electrical performance of the DUT in response to the RF pulse profile test signal are obtained (Step 108). Corrections to pulses in the obtained measurements can then be time aligned based on the mapped error terms (Step 110).

In some embodiments, the present invention includes a computer program product which is a non-transitory storage medium or computer readable medium (media) having instructions stored thereon/in which can be used to program a computer to perform any of the processes of the present invention. Examples of the storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for measuring scattering parameters in a device under test (DUT), comprising:
   a vector network analyzer (VNA) including
      a processor; and
      a non-transitory computer readable storage medium having instructions thereon that when executed by the processor cause the system to
         calibrate the VNA to generate corrections for deterministic setup defects, map a plurality of error terms based on a plurality of time indices,
         wherein each time indicia is associated with an error term,
         transmit a radio frequency (RF) pulse profile test signal to the DUT,
         obtain measurements of electrical performance of the DUT in response to the RF pulse profile test signal, and
         time align generated corrections to pulses in the obtained measurements based on the mapped error terms.

2. The system of claim 1, further comprising:
   a pulse modulator connectable with the VNA and configured for generating the RF pulse profile test signal.

3. The system of claim 1, wherein the VNA includes a pulse modulator configured for generating the RF pulse profile test signal.

4. The system of claim 1, wherein the plurality of time indices are associated with a time shift introduced by an offset of a reference plane to a directional coupler of the VNA.

5. The system of claim 1, wherein the plurality of error terms correspond to directivity, source match and reflection tracking of the VNA.

6. The system of claim 1, wherein the plurality of error terms are obtained based on the generated corrections.

7. The system of claim 1, wherein the step of mapping the plurality of error terms includes time advancing certain error terms from the plurality of error terms relative to other error terms from the plurality of error terms.

8. A method for measuring scattering parameters in a device under test (DUT) using a vector network analyzer (VNA), comprising:
   calibrating the VNA to generate corrections for deterministic setup defects;
   mapping a plurality of error terms based on a plurality of time indices, wherein each time indicia is associated with an error term;
   transmitting a radio frequency (RF) pulse profile test signal to the DUT;
   obtaining a measurement signal from the DUT in response to the RF pulse profile test signal; and
   time aligning generated corrections to pulses in the obtained measurements based on the mapped error terms.

9. The method of claim 8, further comprising:
   using a pulse modulator connected with the VNA to generate the RF pulse profile test signal.

10. The method of claim 8, further comprising:
    using a pulse modulator of the VNA to generate the RF pulse profile test signal.

11. The method of claim 8, wherein the plurality of time indices are associated with a time shift introduced by an offset of a reference plane to a directional coupler of the VNA.

12. The method of claim 8, wherein the plurality of error terms correspond to directivity, source match and reflection tracking of the VNA.

13. The method of claim 8, wherein the plurality of error terms are obtained based on the generated corrections.

14. The method of claim 8, wherein mapping the plurality of error terms includes time advancing certain error terms from the plurality of error terms relative to other error terms from the plurality of error terms.

15. A non-transitory computer readable storage medium, including instructions stored thereon which when read and executed by one or more computers cause the one or more computers to perform the steps comprising:
    use a setup including a vector network analyzer (VNA) connected with a device under test (DUT);
    calibrate the VNA to generate corrections for deterministic setup defects;
    map a plurality of error terms based on a plurality of time indices, wherein each time indicia is associated with an error term;
    transmit a radio frequency (RF) pulse profile test signal to the DUT;
    obtain measurements of electrical performance of the DUT in response to the RF pulse profile test signal; and
    time align generated corrections to pulses in the obtained measurements based on the mapped error terms.

16. The non-transitory computer readable storage medium of claim 5, including instructions stored thereon which when read and executed by one or more computers cause the one or more computers to perform the steps further comprising:
    use a pulse modulator connected with the VNA to generate the RF pulse profile test signal.

17. The non-transitory computer readable storage medium of claim 15, including instructions stored thereon which when read and executed by one or more computers cause the one or more computers to perform the steps further comprising:
    use a pulse modulator of the VNA to generate the RF pulse profile test signal.

* * * * *